United States Patent
Bergeron et al.

(10) Patent No.: US 7,725,864 B2
(45) Date of Patent: May 25, 2010

(54) SYSTEMATIC YIELD IN SEMICONDUCTOR MANUFACTURE

(75) Inventors: Paul H. Bergeron, South Burlington, VT (US); Jason D. Hibbeler, Williston, VT (US); Gustavo E. Tellez, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 89 days.

(21) Appl. No.: 11/854,000

(22) Filed: Sep. 12, 2007

(65) Prior Publication Data
US 2008/0059918 A1     Mar. 6, 2008

Related U.S. Application Data

(62) Division of application No. 10/711,978, filed on Oct. 18, 2004, now Pat. No. 7,337,415.

(51) Int. Cl.
G06F 17/50 (2006.01)
(52) U.S. Cl. .......................... 716/14; 716/10
(58) Field of Classification Search .......... 716/2, 716/4, 8–10, 12–14; 707/100
See application file for complete search history.

(56) References Cited

U.S. PATENT DOCUMENTS

| | | | |
|---|---|---|---|
| 5,636,133 A | 6/1997 | Chesebro et al. | |
| 5,729,466 A | 3/1998 | Bamji | |
| 5,923,059 A | 7/1999 | Gheewala | |
| 5,987,086 A | 11/1999 | Raman et al. | |
| 6,178,543 B1 | 1/2001 | Chen et al. | |
| 6,189,132 B1 | 2/2001 | Heng et al. | |
| 6,247,853 B1 | 6/2001 | Papadopoulou et al. | |
| 6,260,183 B1 | 7/2001 | Raspopovic et al. | |
| 6,301,690 B1 | 10/2001 | Ditlow et al. | |
| 6,305,004 B1 | 10/2001 | Tellez et al. | |
| 6,341,366 B1 | 1/2002 | Wang et al. | |
| 6,421,814 B1 | 7/2002 | Ho | |
| 6,430,733 B1 | 8/2002 | Cohn et al. | |

(Continued)

FOREIGN PATENT DOCUMENTS

CN        1507042 A       6/2004

OTHER PUBLICATIONS

R.L. Hunt, et al., "Automatically Rerouting Wires on Printed-Circuit Boards to Avoid Noise Coupling Problems", IBM Technical Disclosure Bulletin, vol. 18, No. 3, Aug. 1975, p. 762-766.

(Continued)

Primary Examiner—Stacy A Whitmore
(74) Attorney, Agent, or Firm—Richard Kotulak; Greenblum & Bernstein P.L.C.

(57) ABSTRACT

Three-dimensional structures are provided which improve manufacturing yield for certain structures in semiconductor devices. The three-dimensional structures take into account the interaction between an upper layer and a lower layer where the lower layer has a tendency to form a non-planar surface due to its design. Accordingly, design changes are performed to make structures more likely to function, either by forming a more planar surface on the lower layer or by compensating in the upper layer for the lack of planarity. The changes to improve manufacturing yield are made at the design stage rather than at the fabrication stage.

16 Claims, 7 Drawing Sheets

U.S. PATENT DOCUMENTS

| | | |
|---|---|---|
| 6,434,732 B2 | 8/2002 | Juengling |
| 6,711,725 B1 | 3/2004 | Rutenbar et al. |
| 7,076,749 B2 | 7/2006 | Kemerer et al. |
| 7,337,415 B2 | 2/2008 | Bergeron et al. |
| 2002/0184606 A1 | 12/2002 | Ohba et al. |
| 2003/0005401 A1 | 1/2003 | Wimer |
| 2003/0088849 A1 | 5/2003 | Yamauchi |
| 2003/0167451 A1 | 9/2003 | Igarashi |
| 2004/0019862 A1 | 1/2004 | Li et al. |
| 2004/0230922 A1 | 11/2004 | Allen et al. |
| 2005/0278663 A1 | 12/2005 | Kemerer et al. |

OTHER PUBLICATIONS

J.Z. Su, et al., "Post-Route Optimization for Improved Yield Using a Rubber-Band Wiring Model", Computer Aided Design, 1997. Digest of Technical Papers., 1997. IEEE/ACM International Conference on Nov. 9-13, 1997, p. 700-706.

R. Prasad, et al., "The Effect of Placement on Yield for Standard Cell Designs", url = "citeseer.ist.psu.edu/380923.html".

A.B. Kahng, et al., "Non-Tree Routing for Reliability and Yield Improvement", Computer Aided Design, 2002. ICCAD 2002. IEEE/ACM International Conference on Nov. 10-14, 2002, p. 260-266.

A. Venkataraman, et al., "Determination of Yield Bounds Prior to Routing", Defect and Fault Tolerance in VLSI Systems, 1999. DFT '99. International Symposium on Nov. 1999, p. 4-13.

P. Kudva, et al, "Measurements for Structural Logic Synthesis", Computer Aided Design of Integrated Circuits and Systems, IEEE Transactions on vol. 22, Iss. 6, Jun. 2003, p. 665-674.

J.Z. Su, et al., "Post-Route Optimization for Improved Yield Using a Rubber-Band Wiring Model", Computer Aided Design, 1997, Digest of Technical Papers, 1997, IEEE/ACM International Conference on Nov. 9-13, 1997, p. 700-706.

SYSTEMATIC YIELD IN SEMICONDUCTOR MANUFACTURE

CROSS REFERENCE TO RELATED APPLICATIONS

This application is a divisional of U.S. patent application Ser. No. 10/711,978, filed Oct. 18, 2004 now U.S. Pat. No. 7,337,415, the disclosure of which is expressly incorporated by reference herein in its entirety.

BACKGROUND OF INVENTION

1. Field of the Invention

The invention relates to semiconductor fabrication, and more particularly to improving manufacturing yield by modifying design data to create three-dimensional structures of robust design.

2. Background Description

The manufacturing yield of a manufacturing process for semiconductor devices may be affected by a variety of factors. For example, the semiconductor fabrication process may produce a defective circuit due to contamination during fabrication. Such contamination may include foreign particles finding their way onto a surface of a circuit under fabrication. Such a foreign particle can interfere with the manufacturing process so that subsequent steps are not properly completed leading to a malfunctioning device. Malfunctions may include, for example, the shorting of wires to one another or a broken wire on a particular layer of the circuit.

Other factors which may negatively impact semiconductor manufacturing yield may include certain aspects of the device's design. For example, where a device's design specifies wires which are narrower than the narrowest wire that the fabrication process can reliably fabricate, the wire may be formed with a gap therein leading to a permanently open circuit. Another example of a design defect includes wires which are too close together. Where a wire is too close to an adjacent wire, there may be bleeding of one wire to the adjacent wire causing electrical contact between the two. Such unwanted electrical contact causes a permanent short in the circuit and prevents the circuit from functioning properly. Ground-rule checking of a semiconductor design should in practice eliminate errors of this kind, but there are situations in which a design rule is waived, meaning that such a violation maybe permitted.

By contrast, certain geometrical configurations of layout elements can obey all design rules and yet still be difficult to manufacture reliably. For example, types of designs which are prone to producing lowered manufacturing yield include designs which align one particular structure on a first layer with a second particular kind of structure on a second layer. Such problematic designs may lead to one structure affecting the formation of the second structure in a negative way.

In other words, in the manufacture of VLSI integrated circuits, certain three-dimensional structures can be difficult to build reliably. For example, structures such as wires at minimum spacing on a metal layer Mx over wide or large wires on the metal layer Mx-1. Note that this minimum spacing value on layer Mx is typically dependent on the width of the Mx wires, so that minimum-width wires require a smaller wire-to-wire spacing value than is required between wires of larger width. Another example of a difficult to manufacture structure includes wires at minimum spacing on Mx over a trench between two wide wires on Mx-1. In particular, during planarization, the polishing of wide wires on Mx-1 causes a local dishing of the surface (so-called "induced topography"). This topographic variation can cause shorting of the minimum-spaced wires in a subsequent metal layer.

It should be noted that traditional design rules do not prohibit the aforementioned problematic structures. Furthermore, routing programs typically do not recognize or try to avoid such interaction of structures from one layer to the next. Also, any cheesing steps to make a more uniform distribution between metal and dielectric on a layer does not necessarily alleviate the topographic problems because the wider wires can fall under the threshold shape width for which cheesing will be applied. It should also be noted that random-defect analysis does not reveal the presence of the problematic metal structures. Rather, such three-dimensional structures cause systematic yield loss, where, regardless of their physical location in the design of the circuit, they are consistently difficult to manufacture. Furthermore, there have been no automated techniques for treating the systematic defects associated with the induced-topography defects.

Accordingly, manufacturing problems can result from certain two-dimensional structures which should be avoided, such as one wire too close to a second wire, as well as certain three-dimensional structures encompassing multiple layers of a device which should also be avoided. For example, where minimum-spaced wires of an upper layer cross over a large wire of a lower layer, the flatness or planarity of the lower layer may be critical for proper small wire formation on the upper layer. Also, it is well known that where there is a relatively large wire formed by, for example, a damascene process in an oxide or other type of insulator, it may be difficult to form a planar surface across the dielectric and wire surface.

For example, in a damascene process, the lack of planarity across the wire and dielectric is caused primarily during the last step of the process which typically includes a chemical/mechanical polishing (CMP) step. Thus, during the CMP process, because there is such a relatively large expanse of metal for the wide or large wire surface compared to the surface area of the surrounding dielectric, the metal may become dished during the polishing process, leading to a non-planar surface.

Additionally, at the boundary between a wide metal line and adjacent dielectric material, the metal may become slightly recessed below the level of the surrounding dielectric. Thus, the dielectric will then protrude slightly above the surface of the metal large wire and lead to the formation of an unwanted trench at the edges of the metal line. The non-planarity of the dished metal line, and/or the trench, will cause, for example, non-planarity in subsequent layers formed above this lower layer. The non-planarity may then lead to metal wires formed on the subsequent layers being improperly formed and shorting to one another.

Traditional methods of mitigating the effects of such non-planar surfaces on a first layer interfering with the proper formation of structures on a subsequent upper layer traditionally focus on fabrication process changes on a single layer with no consideration given to altering the design of a first layer to solve fabrication problems of a second layer. Thus, a two-dimensional approach is traditionally taken. For example, where an unwanted trench is typically formed at the edge of a wide metal wire, the size of the trench is reduced, or the trench is eliminated altogether, by carefully adjusting the parameters of the polishing step of the CMP process. Accordingly, parameters of the polishing step may be adjusted by either altering the composition of the chemicals used during the CMP process or by altering the length of time of the polishing, etc. However, there must be a balance which has to be achieved between over-polishing—which can lead to trench formations and subsequent problems on higher layers—and under-polishing, which additionally causes non-planarity on the lower layer.

Referring to FIG. 1, for example, small metal wires 12 fabricated at, or close to, the minimum spacing possible on an upper layer are shown crossing a wide wire 14 on a lower layer. Thus, minimum-spaced wires 12 are wires which are manufactured near the lower limits of resolution of the manufacturing process. It should be noted that the wide wire 14 could potentially be dished during the CMP step of the damascene-forming process. Accordingly, where the minimum-spaced wires 12 lie above the wide wire 14, the non-planar surface below may inhibit the proper formation of the wires 12.

Referring still to FIG. 1, a dielectric 15 surrounds the wide wire 14. The dielectric 15 is typically an oxide or a nitride type dielectric. The wide wire 14 is typically copper, but may also be constructed from aluminum, as well as other conductors. Likewise, the minimum-spaced wires 12 are typically copper but may also be constructed from aluminum as well as other conductors.

Accordingly, the minimum-spaced wires 12 pass across the top of the wide wire 14 and then pass onto the dielectric 15. Because the damascene process used to form the wide wire 14 typically causes some dishing of the surface of the wide wire 14, the wide wire 14 and surrounding dielectric 15 may not be planar. Consequently, when an adjacent layer is formed on top of the wide wire 14 which includes, for example, minimum-spaced wires 12 imaged in a photolithographic process, the non-planar surface of the lower layer interferes with the material removal through planarization of the subsequent metal layer, resulting in a shorting of the metal material or of the liner material that is deposited between the metal and the dielectric.

SUMMARY OF THE INVENTION

In a first aspect of the invention, a method of modifying circuit design source data of a three-dimensional structure for improving integrated circuit yield includes spreading wires using a post-routing layout optimizer, and locating a problem structure remaining after post-layout optimizing using a shapes-processing tool. The method also includes implementing at least one local modification to said three-dimensional structure to perform a fix-up process on the problem structure.

In another aspect of the invention, a method of modifying circuit design source data for forming a multi-layer structure of a semiconductor device includes determining whether at least two minimum-spaced wires of an upper layer pass over a dishing-prone structure of a lower layer. If the at least two minimum-spaced wires pass over a dishing-prone structure, the method also includes performing at least one of increasing a space between the two minimum-spaced wires of the upper layer in a region over the dishing-prone structure of the lower layer, forming a dummy hole in a wide wire under the space between the two minimum-spaced wires; and widening a trench between two wide wires under the space between the two minimum-spaced wires.

In another aspect of the invention, a method of modifying circuit design source data of a three-dimensional structure for forming a multi-layer structure of a semiconductor device includes forming a dishing-prone structure on a lower layer. The method also includes forming two minimum-spaced wires over the dishing-prone structure on an upper layer, and increasing a space between the two minimum-spaced wires in a region over the dishing-prone structure. The method additionally includes where if the dishing-prone structure includes a wide wire, inserting a space for a dielectric island in the wide wire under at least one wire of the two minimum-spaced wires; and if the dishing-prone structure includes a narrow trench between two wide wires, widening the trench under at least one wire of the two minimum-spaced wires.

In another aspect of the invention a circuit design source data for a multi-layer structure of a semiconductor device includes an upper layer comprising multiple minimum-spaced wires. The circuit design also includes a lower layer comprising a dishing-prone structure, wherein the multiple minimum-spaced wires of the upper layer are disposed over the dishing-prone structure of the lower layer, and an increased space between at least two wires of the multiple minimum-spaced wires in a region over the dishing-prone structure. The circuit design additionally includes a dummy hole in the wide wire under at least one wire of the multiple minimum-spaced wires if the dishing-prone structure includes a wide wire, and a widened region of the narrow trench under at least one wire of the multiple minimum-spaced wires if the dishing-prone structure includes a narrow trench between two wide wires.

DETAILED DESCRIPTION OF EMBODIMENTS OF THE INVENTION

Figure 1:
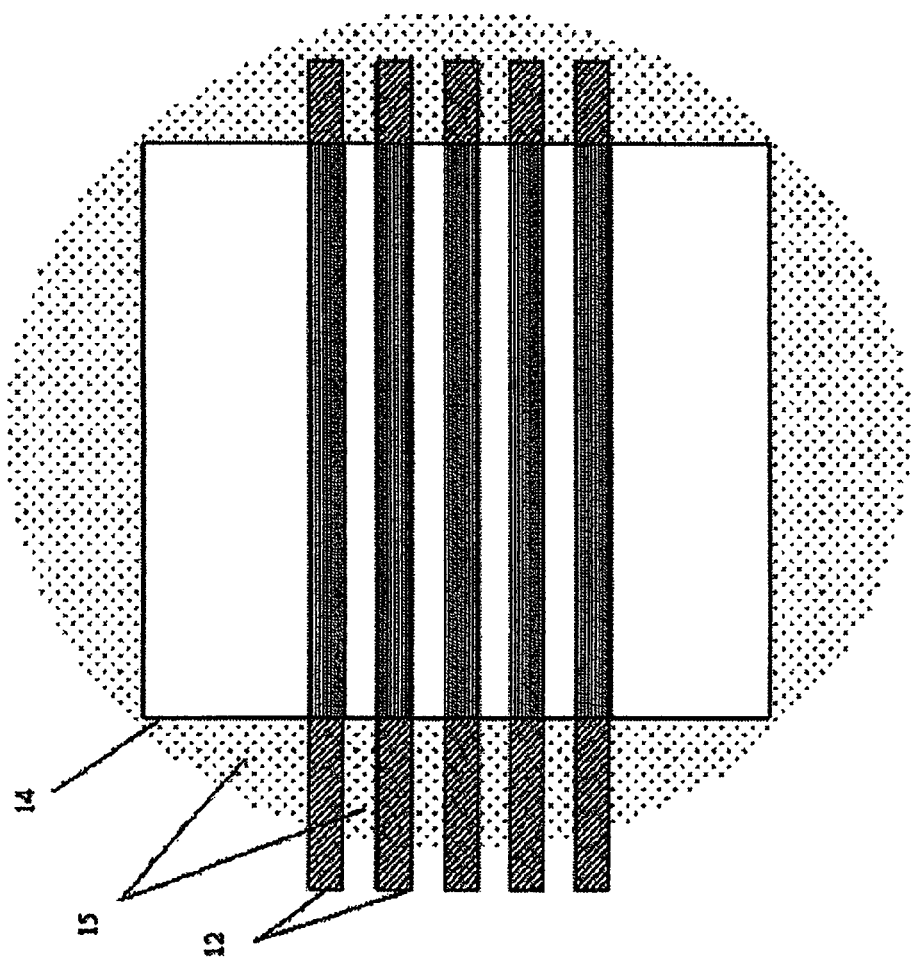
FIG. 1 illustrates minimum-spaced wires passing over a large wire in a conventional system.

The invention allows improved manufacturing yield and thus reduced costs per device by forming three-dimensional structures in devices which are more reliably fabricated. Additionally, embodiments of the invention allow for more complicated devices by making it possible to manufacture the more complicated devices with better manufacturing yield. The invention allows the source data of circuit designs to be modified before the manufacturing step. Thus, the circuit design data is modified before the actual circuit manufacturing process begins. Consequently, structures which are prone to causing manufacturing defects are modified after the design process or as the final step in the design process and before the fabrication process.

The modifications to the circuit design data are transparent to the fabrication process and are accordingly implemented in the fabrication process as if they were part of the original design. Due to such transparency, a circuit design data modification is often referred to in the sense of physical changes to the circuit itself. However, embodiments of the invention are directed to modifying circuit design data which results in the modification subsequently being implemented during fabrication. Additionally, in some embodiments, three-dimensional structures are formed across multiple layers of a semiconductor device, where an upper layer section is based, in part on the design of a lower layer section. Thus, embodiments of the invention include structures which span multiple layers rather than treating each layer as independent structures.

Such three-dimensional structures span multiple layers of a circuit and may be referred to as a problem or problematic structure because the manufacturing steps required to fabricate one layer of a structure can cause a manufacturing defect in a second layer of the structure. Thus the problem is one where adjacent structure components from one layer to the next are incompatible with one another, and at least one of the structure components on a particular layer should be modified to reduce or eliminate the incompatibility. However, the invention provides for an improved process yield by treating the problem as one of a three-dimensional nature and preventing a manufacturing defect on one layer by modifying another layer.

In one implementation, embodiments of the invention may use a shapes-processing tool to locate each of the problem structures remaining after detail routing. For each of the problem structures, a ground-rule fix-up process is performed, using a minimum perturbation, hierarchy-preserving technology-migration tool. At least two classes of ground rules may be formulated to reduce or eliminate minimum-spaced wires over large or wide wires.

For example, a minimum spacing for level Mx_w should be 2 s where "s" is the ground-rule minimum spacing for Mx; and Mx_w is a derived level representing minimum-spaced Mx over wide Mx-1. This derived level can be constructed with the aid of a shapes-processing tool using marker shapes, in which case another rule holds Mx_w within Mx, causing the two to move together. Another example includes minimum width for level Wx must be 2 s, where Wx is a derived level representing the space between minimum-spaced Mx over wide Mx-1. Shapes on the derived level Wx are created using a shapes-processing program, and other rules keep the derived shapes on Wx disjoint from Mx.

Embodiments of the technology-migration program may then optimize the layout shapes in such a way as to fix the ground rules above while modifying the layout as little as possible. Such changes are typically local in nature, and confined to the immediate vicinity of the problematic structures. In addition, the layout optimizer may introduce "jogs" in the Mx wires: short segments of "wrong-way" wiring that allow maximum flexibility in enforcing modified ground rules. After optimization, all marker shapes are removed. The effect of enforcing either of these two ground rules is to increase the space of the minimum-spaced wires over wide structures such as wide Mx-1 wires and wide Mx trenches.

Additionally, for each target location for which the ground-rule fix-up has not been successful, further steps may be employed. For example, a slotting step may be performed where a shapes-processing program is used to break wide wires or buses on a layer Mx-1 into groups of narrower wires that are tied together so as not to reduce the current-carrying capacity of the Mx-1 buses. For over-trench structures for which slotting is not possible, the wide wire on Mx-1 may be "shaved" by using a shapes-processing program to reduce the width of wide wires on Mx-1 directly underneath the minimum-spaced Mx wires and so increase the width of the trench between the Mx-1 wires.

An additional method to fix problem structures involves using a router to move problematic wires. When a particular problem-causing geometry is identified, a script is created that inserts a wiring blockage shape at the same place as the one or more of the problematic wires. The places where the existing wires touch these new blockage shapes are seen as violations by the router, and the router attempts to fix these violations by re-routing the problematic wires. This method of resolving the problem typically works only if the wiring database, and not just the shapes data, is available.

In other words, a problem area involving a three-dimensional structure is first identified. To resolve the problem, an automatic routing program is used to move one or more wires. The wires are moved as follows. First create blockage shapes in the wiring database for the routing program that cover the wires. The routing program sees these blockage shapes as ground-rule violations, i.e. places where a wire hits another shape on the same layer. The routing program attempts to fix these violations by removing the offending wire and creating a new wiring route. The end result is the elimination of the problem structure. As such, command script is created for the routing program that contains the coordinates of these blockage shapes to be created. Commands in this script tell the routing program to create the blockage shapes and then repair the wire-to-blockage violations.

Figure 2:
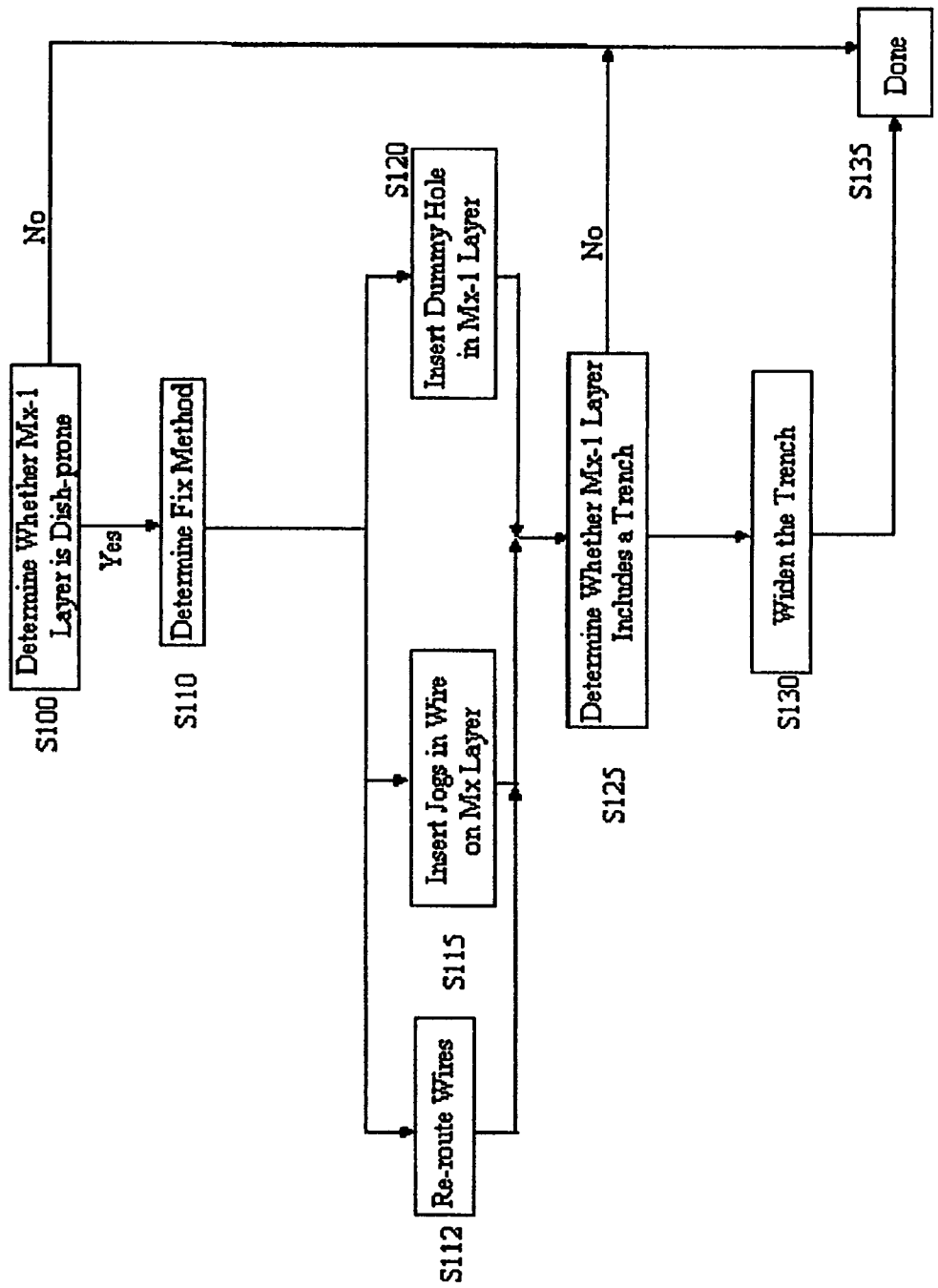
FIG. 2 is a logic flowchart showing steps of using an embodiment the invention.

FIG. 2 is a flow diagram of an embodiment showing steps of using the invention beginning at S100. FIG. 2 may equally represent a high-level block diagram of components of the invention implementing the steps thereof. The steps of FIG. 2 may be implemented on computer program code in combination with the appropriate hardware. This computer program code may be stored on storage media such as a diskette, hard disk, CD-ROM, DVD-ROM or tape, as well as a memory storage device or collection of memory storage devices such as read-only memory (ROM) or random access memory (RAM). Additionally, the computer program code can be transferred to a workstation over the Internet or some other type of network. FIG. 2 may also be implemented, for example, using steps of FIGS. 3-7.

Continuing with the flow of FIG. 2, it is first determined whether a structure on a layer Mx, which is susceptible to topographically induced formation error, lies over a structure in the Mx-1 layer which may cause a manufacturing error in the Mx layer due to Mx-1 topography (S100). For example, the Mx-1 layer may include a wide wire which is prone to dishing or two wide wires separated by a trench which is also prone to dishing, and the Mx layer may include minimum-spaced wires. If there is no dish prone structure on the Mx-1 layer under a structure susceptible to topographic formation errors on the Mx layer, no design changes are needed and the process is done (S135).

If the dish prone structure includes a wide wire, one or more design modifications are chosen from a group of possible design modifications (S110). For example, the wires may be re-routed (S112). Additionally, if there are sufficient free wiring tracks near the problematic wires on layer Mx, then the wires can be spread apart. One possible design change for minimum-spaced wires includes inserting jogs in the wires and then increasing the spacing between the Mx wires; these jogs allow greater flexibility in the creation of space between existing wires (S115). Another possible design change includes inserting a hole which will become filled with dielectric during manufacturing—in the dishing-prone structure on the Mx-1 layer to reduce dishing (S120). Refer to FIGS. 3-6 for an example.

Figure 7:
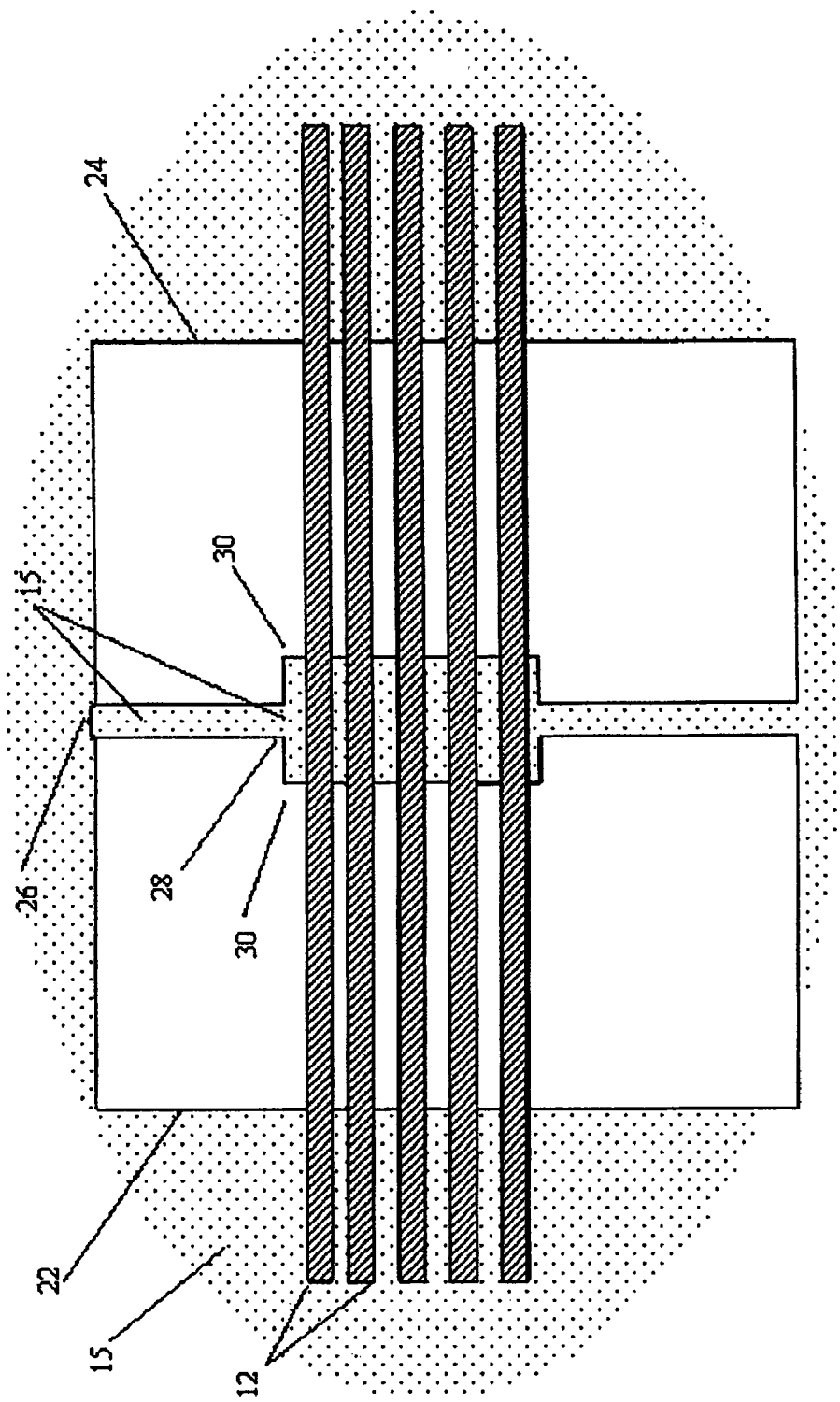
FIG. 7 illustrates minimum-spaced wires passing over a large wire in accordance with the invention.

The logic flow then determines whether there is a wide wire next to a trench (S125). If there is no wide wire next to a trench, the logic flow is done at S135. If there is a wide wire next to a trench, the trench is modified (S130). For example, the trench may be locally widened by narrowing a portion of the wide wires under the minimum-spaced wires to reduce the amount of dishing on the Mx-1 level. After the trench has been appropriately modified, the logic flow is done at S135. Refer to FIG. 7 for an example.

Figure 3:
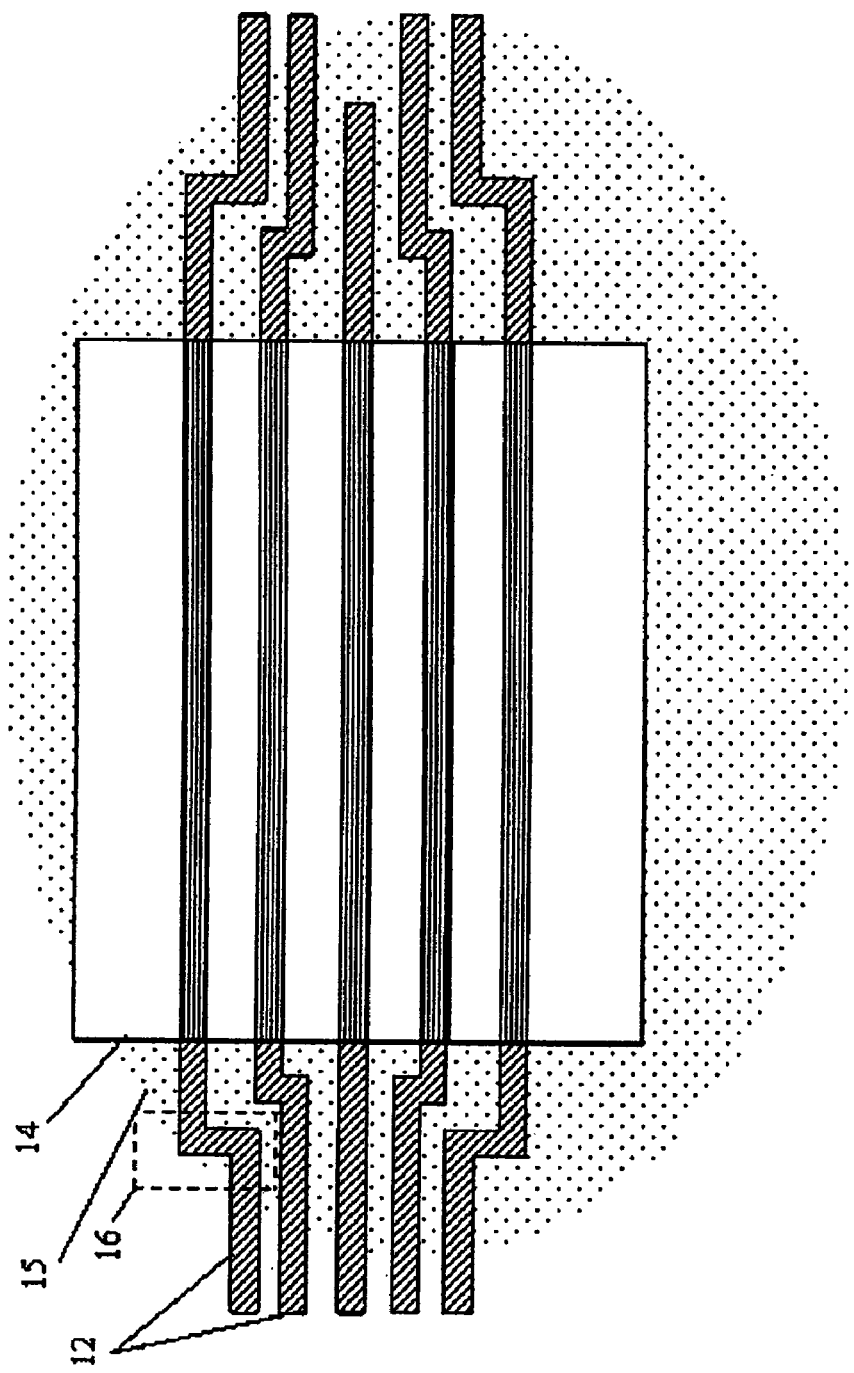
FIG. 3 illustrates minimum-spaced wires passing over a large wire in accordance with the invention.

Utilizing the method of the invention and referring to FIG. 3, an example of minimum-spaced wires 12 passing over a wide wire 14 is shown. The wide wire 14 is formed on a lower layer and is surrounded by a dielectric 15. The minimum-spaced wires 12 are formed on an upper layer. In order to avoid shorting caused by the typically non-planar or dished wide wire 14, the minimum-spaced wires 12 are designed to have a jog 16 in the minimum-spaced wires 12. The jog is a point in the wire where a wire segment in the perpendicular direction is inserted. The length of the perpendicular wire segment is determined by the optimization process in attempting to increase the space between the minimum-spaced wires 12, the optimizer creates perpendicular segments of the appropriate length. In other words, the jogs allow a smaller part of each wire to be moved in order to create space. In particular, a minimum-spaced wire 12 may have one or more jogs 16, where the jog 16 is positioned over the dielectric 15 of the lower layer proximate the junction between the dielectric 15 and the wide wire 14. It should also be noted that each wire in a group of wires may require a different jog position and/or a different size jog.

Accordingly, the minimum-spaced wires 12 are locally spread apart in a region concentrated on and proximate to the wide wire 14. Typical values of the new wire spacing, include, for example, twice the ground-rule spacing minimum for minimum-width wires. Thus, the jogs 16 in the minimum-spaced wires 12 increase the flexibility of layout-optimization tool to create spacing between adjacent wires, thereby reducing the chances that the minimum-spaced wires 12 when improperly created due to the dishing of the wide wire 14 will short together. In other words, the jogs 16 increase the likelihood that the layout-optimization tool will be able to create spacing between the minimum-spaced wires, thereby reducing the chance of the minimum-spaced wires 12 will short and allows for some errors in the minimum-spaced wire 12 formation process.

Figure 4:
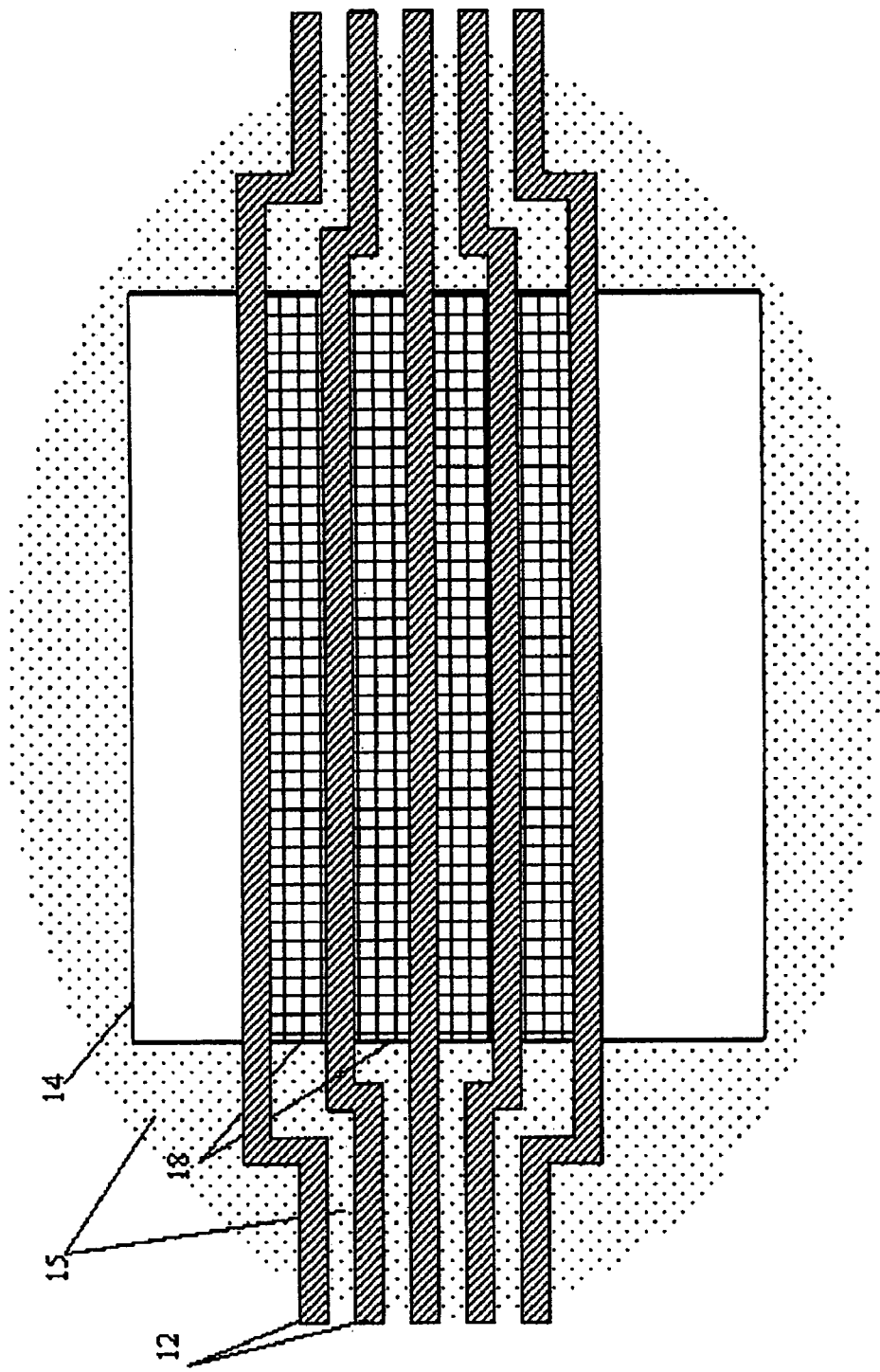
FIG. 4 illustrates minimum-spaced wires passing over a large wire in accordance with the invention.

Referring to FIG. 4, an example of a wide wire 14 surrounded by a dielectric 15 on a lower layer with minimum-spaced wires 12 passing over an upper layer in accordance with the invention is shown. The wide wire 14 could have a dished surface due to being formed by a process including a CMP step. In order to prevent shorting of the minimum-spaced wires 12 due to the non-planar surface of the wide wire 14, the space 18 between the minimum-spaced wires 12 is enlarged locally. Typical values of the new wire spacing, might be, for example, twice the ground-rule spacing minimum for the wires 12.

It should be noted that enlarging the space 18 between the minimum-spaced wires 12 includes enlarging the space 18 at substantially only above the wide wire 14 and portions of the minimum-spaced wires 12 immediately above the wide wire 14. Accordingly, the minimum-spaced wires 12 are locally spread in the region above the wide wire 14, and other regions of the minimum-spaced wires 12 are not affected. Consequently, the local spreading is achieved by increasing the space 18 between the minimum-spaced wires 12. Additionally, a substantial portion of the length of the minimum-spaced wires 12 not over the wide wire 14 remains undisturbed, while only that region of the minimum-spaced wires 12 which is susceptible to shorting is spaced a further distance apart. In other words, the portions of the minimum-spaced wires 12 affected by enlarging the space 18 is substantially limited to the area immediately above the wide wire 14.

Figure 5:
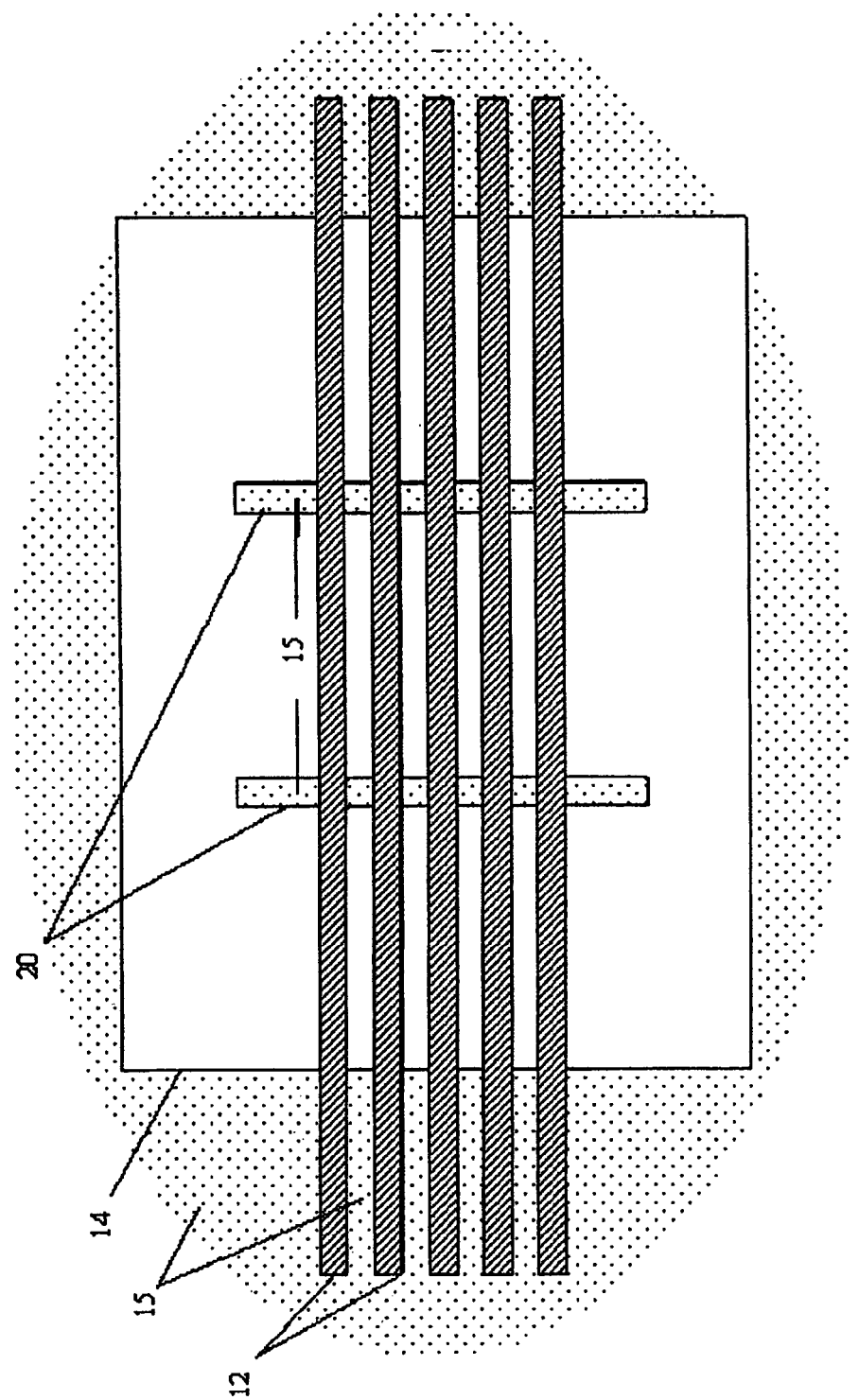
FIG. 5 illustrates minimum-spaced wires passing over a large wire in accordance with the invention.

Referring to FIG. 5, an example of a wide wire 14 surrounded by a dielectric 15 on a first layer in accordance with the invention is shown. Passing across the top of the wide wire 14 on an upper layer are minimum-spaced wires 12. The relatively large surface area of the wide wire 14 is broken, or interrupted by holes 20. Typical dimensions of a hole 20, include, for example, three to four times the ground-rule minimum spacing value for the wide metal lines on the lower layer. The holes 20 are formed in the wide wire 14 and allow dielectric 15 to protrude through the wide wire 14. The holes 20 are filled with the dielectric 15 during manufacturing, with the result that the upper surface of dielectric 15 is substantially level with the surface of the surrounding the wide wire 14.

The holes 20 are positioned so that the minimum-spaced wires 12 which pass over the wide wire 14 additionally pass over the holes 20. The holes 20 are generally elongated structures which are oriented approximately perpendicular to the long axis of the minimum-spaced wires 12. Accordingly, the holes 20 reduce dishing of the wide wire 14; however, the holes 20 do not substantially alter the design or electrical characteristics of the minimum-spaced wires 12.

In particular, the holes 20, by allowing the dielectric 15 to protrude up through the central regions of the wide wire 14 act as a polish stop during the CMP step. Thus, the holes 20 tend to reduce the amount of dishing caused by over polishing of the wide wire 14 during the CMP step. Accordingly, by reducing the amount of dishing of the wide wire 14, the surface of the wide wire 14 and surrounding dielectric 15 tends to be more planar, thus avoiding creating defects in the minimum-spaced wires 12 formed on the next layer thereabove. Thus, the minimum-spaced wires 12 need only pass over that portion of the wide wire 14 which has had its planarity improved by the presence of the dummy hole 20.

Figure 6:
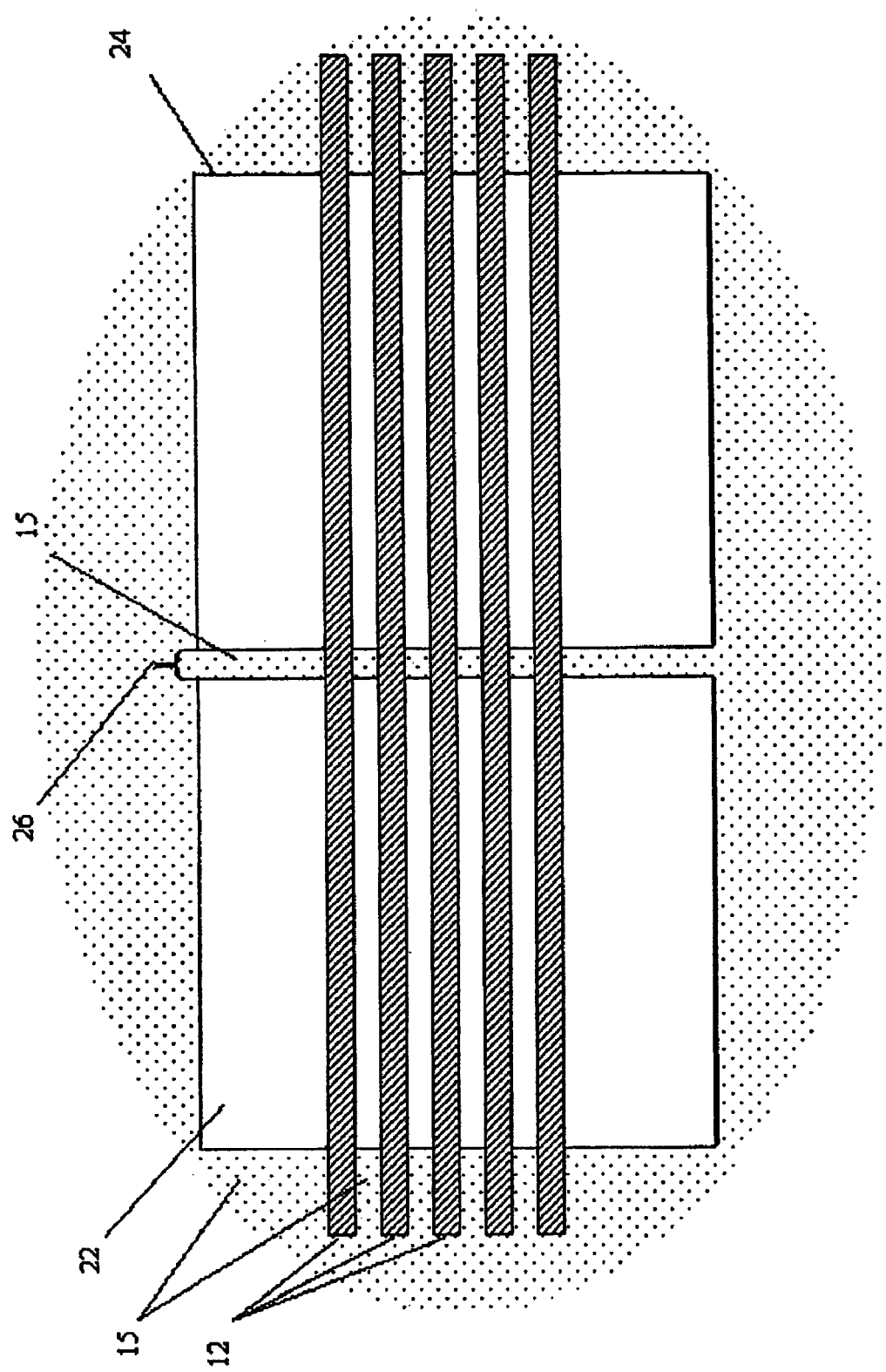
FIG. 6 illustrates minimum-spaced wires passing over two large wires with a trench therebetween.

Referring to FIG. 6, an example of a first large wire 22 and a second large wire 24 formed on a lower layer of a semiconductor device and surrounded by a dielectric 15 in accordance with the invention is shown. A filled trench 26 is formed between the first large wire 22 and the second large wire 24. Typical dimensions of the trench 26, include, for example, the ground-rule minimum spacing value for the wide metal lines 22 and 24. The trench 26 is filled with the same dielectric as surrounds the large wires, 22 and 24. Passing over the first large wire 22 and the second large wire 24, on an upper layer, are minimum-spaced wires 12. The minimum-spaced wires 12 are oriented such that they pass over the trench 26 at substantially a right angle to the long axis to the trench 26 although other angles of intersection may also be included.

During formation of the lower layer having the two large wires, 22 and 24, and the dielectric 15 filled trenches 26 therebetween, more polishing is required during the CMP step due to the presence of the dielectric 15 which is a polishing-resistant material in the trench 26. Because the dielectric 15 of the trench 26 is more resistant to polishing, it thus requires greater amounts of polishing to achieve a satisfactorily smooth surface. Accordingly, the minimum-spaced wires 12 will typically be formed over a dished surface, thereby increasing the chances that the minimum-spaced wires 12 will be improperly formed.

However, in the embodiment of FIG. 7 an example of a lower layer having a first wide wire 22 and a second wide wire 24 with a filled trench 26 formed therebetween in accordance with the invention is shown. The first and second wide wires, 22 and 24, are surrounded by a dielectric 15, where the dielectric 15 fills the trench 26. On an upper layer above the lower layer are formed minimum-spaced wires 12. The minimum-spaced wires 12 are formed such that their long axis is approximately perpendicular to the long axis of the first and second large wires 22 and 24.

The first and second large wires, 22 and 24, have a shaved area 30 located next to the filled trench 26. Typical dimensions of a shaved area 30, include, for example, three to four times the ground-rule minimum spacing value for the wide metal lines 22 and 24. The shaved area 30 corresponds to a location on the large wires, 22 and 24, having a portion removed from the respective edges, next to the trench 26. Accordingly, the shaved area 30 provides a widened region 28 of the trench 26. The widened region 28 of the trench 26 corresponds to where the minimum-spaced wires 12 cross the trench 26. Accordingly, the widened region 28 of the trench 26 reduces the amount of dishing in the surface of the large wire, 22 and 24, of the lower layer and thereby provides a more uniform surface upon which to form the minimum-spaced wires 12.

As described above, the method of the invention improves manufacturing yield and may include steps to modify an existing physical design to decrease the incidence of topography-inducing defects or problematic structures and thereby increase the manufacturing yield of a VLSI design. These steps may include, in any order or singularly or in combination: 1) targeted wire bending, which has the effect of increasing the space between minimum-pitch wires; 2) targeted ground-rule fix-up, using a technology migration tool and modified ground rules altering the problematic structure into a more easily manufactured design or otherwise prohibiting the problematic structures itself; 3) re-routing of wires; 4) slotting of wide wires on a lower layer in the area of the problematic structure; and 5) shaving, to reduce the width of a wide wire or wires on a lower layer in the area of the problematic structure.

While the invention has been described in terms of exemplary embodiments, those skilled in the art will recognize that the invention can be practiced with modifications and in the spirit and scope of the appended claims.

What is claimed is:

1. Circuit design source data stored in a machine readable storage medium used in a design process for a multi-layer structure of a semiconductor device, comprising:
    an upper layer comprising multiple minimum-spaced wires;
    a lower layer comprising a dishing-prone structure, wherein the multiple minimum-spaced wires of the upper layer are disposed over the dishing-prone structure of the lower layer;
    an increased space between at least two wires of the multiple minimum-spaced wires in a region over the dishing-prone structure;
    a dummy hole in the wide wire under at least one wire of the multiple minimum-spaced wires if the dishing-prone structure includes a wide wire; and
    a widened region of the narrow trench under at least one wire of the multiple minimum-spaced wires if the dishing-prone structure includes a narrow trench between two wide wires,
    wherein the upper layer and the lower layer are arranged on a multi-layer structure of a semiconductor device implementing the circuit design source data.

2. The circuit design data of claim 1, comprising a jog in at least one wire of the multiple minimum-spaced wires proximate the dishing-prone structure.

3. The circuit design data of claim 2, comprising at least two jogs in at least one wire of the multiple minimum-spaced wires proximate the dishing-prone structure.

4. The circuit design data of claim 1, wherein an increased space between at least two wires of the multiple minimum-spaced wires comprises an adjustable shape between the at least two wires of the multiple minimum-spaced wires.

5. The circuit design data of claim 1, wherein the dishing prone structure includes the wide wire.

6. The circuit design data of claim 5, wherein the dummy hole is arranged to become filled with dielectric during manufacturing.

7. The circuit design data of claim 1, wherein the dishing-prone structure includes the narrow trench between two wide wires.

8. The circuit data of claim 1, wherein the increased space between the at least two wires equals twice a ground-rule spacing minimum for the at least two wires.

9. The circuit design data of claim 1, wherein the circuit design source data is operable to be at least one of created and modified by at least one of: a computer-implemented shapes-processing tool, a computer-implemented technology migration tool, and a computer-implemented routing program.

10. The circuit design data of claim 1, wherein:
    the circuit design source data is based on a computer-implemented modification of an original design of the multi-layer structure of the semiconductor device, and
    the modification is operable to be implemented during fabrication of the multi-layer structure of the semiconductor device.

11. Circuit design source data stored in a machine readable storage medium used in a design process for a multi-layer structure of a semiconductor device, comprising:
    an upper layer comprising multiple minimum-spaced wires;
    a lower layer comprising a dishing-prone structure, wherein the multiple minimum-spaced wires of the upper layer are disposed over the dishing-prone structure of the lower layer;
    an increased space between at least two wires of the multiple minimum-spaced wires in a region over the dishing-prone structure;
    a dummy hole in the wide wire under at least one wire of the multiple minimum-spaced wires if the dishing-prone structure includes a wide wire; and
    a widened region of the narrow trench under at least one wire of the multiple minimum-spaced wires if the dishing-prone structure includes a narrow trench between two wide wires,
    wherein the upper layer and the lower layer are arranged on a multi-layer structure of a semiconductor device implementing the circuit design source data,
    an increased space between at least two wires of the multiple minimum-spaced wires comprises an adjustable shape between the at least two wires of the multiple minimum-spaced wires, and
    the adjustable shape in the wide wire comprises a gap in the wide wire approximately perpendicular to a long axis of the at least one wire of the multiple minimum-spaced wires.

12. The circuit design data of claim 11, wherein the circuit design source data is operable to be at least one of created and modified by at least one of: a computer-implemented shapes-processing tool, a computer-implemented technology migration tool, and a computer-implemented routing program.

13. The circuit design data of claim 11, wherein:
    the circuit design source data is based on a computer-implemented modification of an original design of the multi-layer structure of the semiconductor device, and
    the modification is operable to be implemented during fabrication of the multi-layer structure of the semiconductor device.

14. Circuit design source data stored in a machine readable storage medium used in a design process for a multi-layer structure of a semiconductor device, comprising:
- an upper layer comprising multiple minimum-spaced wires;
- a lower layer comprising a dishing-prone structure, wherein the multiple minimum-spaced wires of the upper layer are disposed over the dishing-prone structure of the lower layer;
- an increased space between at least two wires of the multiple minimum-spaced wires in a region over the dishing-prone structure;
- a dummy hole in the wide wire under at least one wire of the multiple minimum-spaced wires if the dishing-prone structure includes a wide wire; and
- a widened region of the narrow trench under at least one wire of the multiple minimum-spaced wires if the dishing-prone structure includes a narrow trench between two wide wires,
- wherein the upper layer and the lower layer are arranged on a multi-layer structure of a semiconductor device implementing the circuit design source data, and
- a widened region of the narrow trench comprises a narrow region of at least one wide wire of the two wide wires.

15. The circuit design data of claim 14, wherein the circuit design source data is operable to be at least one of created and modified by at least one of: a computer-implemented shapes-processing tool, a computer-implemented technology migration tool, and a computer-implemented routing program.

16. The circuit design data of claim 14, wherein:
- the circuit design source data is based on a computer-implemented modification of an original design of the multi-layer structure of the semiconductor device, and
- the modification is operable to be implemented during fabrication of the multi-layer structure of the semiconductor device.

* * * * *